IMAGE INTENSIFIER INCLUDING SEMICONDUCTOR AMPLIFIER LAYER

Filed June 1, 1965

INVENTORS.
BENJAMIN KAZAN,
JOHN S. WINSLOW,
By THEIR ATTORNEYS
Spensley & Horn

INVENTORS.
BENJAMIN KAZAN,
JOHN S. WINSLOW,
By THEIR ATTORNEYS.
Spensley & Horn.

United States Patent Office 3,441,736
Patented Apr. 29, 1969

3,441,736

IMAGE INTENSIFIER INCLUDING SEMICONDUCTOR AMPLIFIER LAYER

Benjamin Kazan, Pasadena, and John S. Winslow, Altadena, Calif., assignors to Electro-Optical Systems, Inc., Pasadena, Calif., a corporation of California Filed June 1, 1965, Ser. No. 460,193
Int. Cl. H01j *39/12*
U.S. Cl. 250—213 18 Claims

ABSTRACT OF THE DISCLOSURE

A solid state light image intensifier including preferably a photoconductor layer arranged to receive a source of light. A semiconductor solid state amplifier in the form of a layer of semiconductor material is disposed adjacent the photoconductor layer. On the opposite side of the photoconductor layer is an electroluminescent layer. Separating the photoconductor layer from the semiconductor amplifier layer is an insulator layer. A plurality of electrodes are placed on the exposed surface of the photoconductor layer and the electroluminescent layer. These electrodes are maintained at different D.C. potentials. The photoconductor develops an intensified light emission corresponding to light variations received by the photoconductor.

An image intensifier using chopped light offers the possibility of operation at much lower input light thresholds compared to a photoconductor input intensifier operated without chopping. At the same time, the operation in a chopped mode enables much higher speeds of response to be obtained. Heretofore chopping techniques have not been considered for solid-state image intensifiers because of the requirements of adding a high gain amplifier at each picture element coupled with the fact that the individual elements must be small, closely packed and uniforms in characteristics.

The possibility of fabricating arrays of large numbers of small amplifying elements has been opened by the recent progress in thin-film amplifiers made from evaporated layers of semiconductor materials such as CdS. Such amplifiers have the advantage that they can be fabricated by evaporation on a variety of substrates. Uniform arrays of such small amplifier elements can be fabricated onf a single sheet of evaporated semiconductor, covering an area several centimeters in diameter.

An important intensifier design problem is the development of a circuit and suitable structural arrangement for combining the chopped photoconductor with the amplifier element. In principle, a photoconductor-resistor voltage-divider can be used at each intensifier element to provide voltage variations at the amplifier input. Such a scheme has been used in the prior art and leads to relatively complicated structural problems when applied to an image intensifier since a separate photoconductor and resistor elements must be provided at each element.

To avoid this problem, a new scheme is proposed here which simplifies the input structure of the chopped-light intensifier. The new intensifier is a form of solid-state intensifier operating with chopped light and incorporating an amplifying stage between the photoconductor and output phosphor. The photoconductor is a continuous film upon the surface of which is an array of parallel conducting strips which may be laid down, for example, by evaporation. A direct current potential is maintained between alternate strips. The chopped input light may be produced by a reciprocating lenticular lens or grating.

In a single element of the intensifier, a light bundle is assumed to illuminate about half the photoconductor between two adjacent electrodes, with the center of this light bundle being closer to one of the electrodes. Assuming that the conductivity of the illuminated photoconductive layer will have a potential close to the potential of that electrode, if now, the incident light bundle is shifted so that its center is closer to the other of the two adjacent electrodes, the photoconductor will acquire a potential close to that of the other electrode. As a result of the reciprocating action of the light chopper, the illuminated area of the photoconductor will vary in potential to a degree depending on the intensity of the incident light.

Below the illuminated area of the photoconductor a thin insulating layer and semiconductor layer together with appropriate electrodes constitute a field-effect transistor without a gate electrode. As in the conventional field-effect transistor, alternating current modulation of the potential of the illuminated portion of the photoconductor will modulate the flow of current across the field effect transistor. An electroluminescent phosphor film or layer is provided between the field effect transistor electrodes and the semiconducting layer. This electroluminescent layer is conductive for direct current to enable a steady-state current flow between the field effect transistor electrodes but emits light only under an alternating light condition, i.e., when the current flow is modulated as would occur when the illuminated photoconductor area is modulated by chopped light incident thereon.

The existence of a phosphor material which is conductive for direct currents but emits light only under modulated light conditions has been demonstrated. It consists of ZnO powder, suitably processed to make it conductive, mixed with a plastic binder generally used with the familiar electroluminescent phosphor powder. The mixture becomes conductive but emits no light with direct current applied thereto. However, the application of an alternating current generates an output light comparable to the familiar plastic-binder phosphor. Since the usual phosphor powder layers require alternating potentials of the order of 100 volts for substantial light output, for intensifier purposes it is desirable to use such phosphor powder layers which are very thin and fabricated with fine particles to reduce the operating voltage.

Evaporated thin-film phosphor layers are adaptable for such use since such layers have been shown to operate with considerable light output below 10 volts.

An alternative structure for the image intensifier of this invention employs the same input photoconductor and method of chopping as described above with the insulator and semiconducting amplifier layer arranged as before. However, to separate these layers from the phosphor layer, they are fabricated on the surface of a Fotoform Glass sheet with an array of holes therethrough. Fotoform Glass is a trademark of the Corning Glass Works Company of Corning, N.Y., for a certain glass. Fotoform Glass is a glass which is particularly advantageous for use as an electrical material such as in lighting cells and the like, it being particularly satisfactory where a large number of tolerance holes and precision shapes are required. These holes are filled with conducting plastic or equivalent material to provide conducting cores. In registry with the lower side of each conducting core there is provided a conducting element. The surface is then coated with the phosphor layer, either of the powder type or evaporated film type and finally a transparent electrode, for example, an evaporated gold film is provided on the phosphor surface. Aside from structural differences, the basic operation of this intensifier is the same as the previous intensifier. Such a structure may have the advantage of reducing chemical interaction between the phosphor and semiconducting layers during fabrication.

A third form of intensifier according to this invention incorporates the more compact type of thin-film field effect transistor in which the drain electrode is placed on the surface of the semiconductor opposite from the source electrode so that the amplified current in effect passes through the layer instead of along the surface. The use of this type of field effect transistor makes possible the design of a chopped-light intensifier with a relatively simple structure. Here, as in the previous structures, the potential of the illuminated area of the photoconductor is modulated as a result of the chopped light incident thereon. These potential variations modulate the current flow through the amplifying layer. A coating in contact with the phosphor layer here acts as the drain electrodes.

In all of the above structures as in all high gain intensifiers specific means must be incorporated to prevent optical feedback. Two fundamental approaches to this problem are: (1) to choose the spectral response of the photoconductor and the spectral emission of the phosphor so that they do not overlap; (2) to interpose an opaque barrier between the phosphor and the photoconductor.

The use of a blue emitting phosphor with an infrared sensitive photoconductor may reduce the feedback factor to $10^{-2}$ or less. Greater reduction could be accomplished by providing the opaque layer adjacent to the phosphor layer as in previous intensifier designs. In the photoform glass structure the glass may be made opaque.

Accordingly it is an object of this invention to provide a chopped light image intensifier.

It is another object of this invention to provide a chopped light image intensifier incorporating a solid state amplifier sandwiched between the photoconductive and luminescent layers thereof.

It is a further object of this invention to provide a chopped light image intensifier wherein a field effect transistor amplifying means is interposed between the photoconductive and the luminescent layers thereof.

It is still another object of this invention to provide an image intensifier which is conductive in the presence of a direct current or constant light impinging thereon, but which emits light only when the light impinging thereon is alternating in intensity or interrupted so as to produce an alternating light input.

It is still a further object of this invention to provide a chopped light image intensifier comprising thin film solid state elements in a laminate of photoconductive, amplifying and luminescent layers excited by a modulated light means.

It is yet another object of this invention to provide a chopped light image intensifier wherein the luminescent layer, semiconducting layer and photoconductive layer are fabricated on the surface of a photoformed glass sheet having an array of holes therethrough said holes being filled with a conductive plastic to form conductive cores therein.

It is yet a further object of this invention to provide a chopped light image intensifier wherein the photoconductive layer thereof is separated from the luminescent layer thereof by a thin film field effect semiconducting amplifier wherein the drain electrode is placed on the surface of the semiconducting amplifier opposite the source electrode thereof so as to permit the amplified current thereof to pass through the semiconducting amplifier layer rather than along the surface thereof.

It is an even further object of the invention to provide a chopped light image intensifier of extremely simple structure.

And a still further object of this invention is to provide an interrupted light signal amplifying image intensifier wherein the light feedback factor is substantially reduced.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

In the drawings:

FIGURE 1 shows in schematic form typical light chopping means used with an image intensifier in accordance with this invention;

As has been hereinabove generally described, the basic concept of this invention contemplates an image intensifier means wherein the intensifier element comprises a photoconductive layer, a semiconducting amplifying layer and a luminescent layer in a laminate structure wherein the luminescent element does not emit light except when the input light is varying in intensity as may be the case when the light is interrupted or chopped in a manner resulting in a modulated light input.

Figures 1A, 1B, 2:
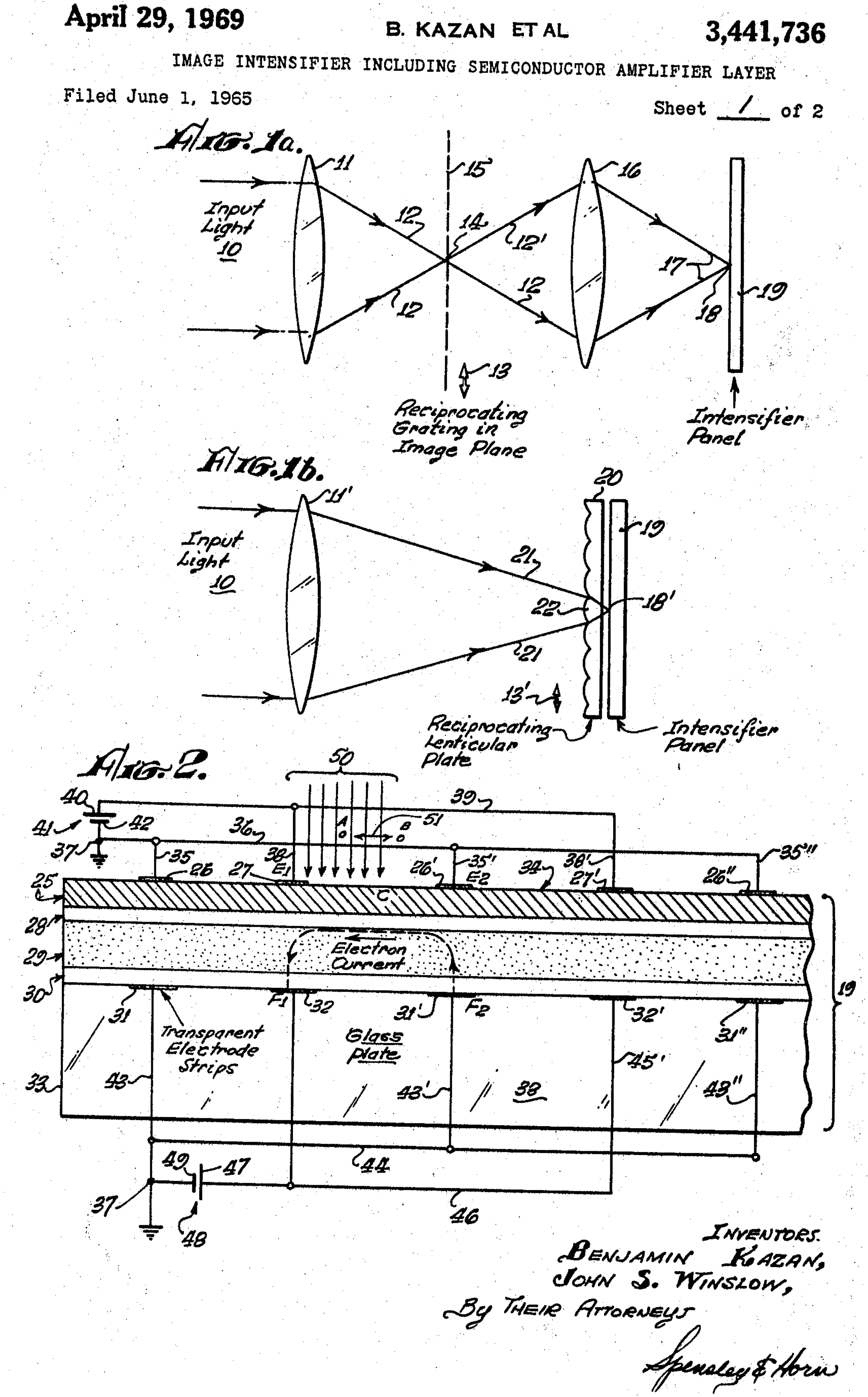
FIGURE 2 is a cross-section through one form of image intensifier according to this invention.

With reference to FIGURE 1, this concept is illustrated schematically in two forms thereof. In FIGURE 1*a* is shown the image intensifier plate 19 wherein the interrupted light is achieved by the action of a grating element 15 which is reciprocated in the light path. In FIGURE 1*b* the reciprocating light interruptor is a lenticular plate 20.

In the case of an image intensifier, as in the case of a single-element detector, it is possible to chop the input light by a suitably-positioned aperture whose opening and closing modulates the entire light flux reaching the intensifier. Since a large image plane and correspondingly larger aperture would require appreciable amplitude of motion for the shutter it is desirable to consider other arrangements or chopping mechanisms requiring less mechanical motion.

The grating structure 15 to accomplish light interruption shown in FIGURE 1*a* consists of a grid of grating of parallel opaque strips. This grating is placed in an image plane 14 so that both the grating 15 and the input optical scene 10 are in turn imaged onto the surface 18 of intensifier 19 as indicated by rays 12, 12′ and 17. It is assumed that the width of the grating strips and spaces are equal and that the distance between centers of the grating, as imaged on the intensifier 19 is equal to the distance between centers of the elements of intensifier 19 further described below. In operation grating 15 is caused to reciprocate as shown at 13 in a direction perpendicular to the optical axis by an amount equal to the distance between the above mentioned elements of intensifier 19. As a result of this, the input light 10 will fall alternately on one half of the elements of intensifier 19 and then on the other half.

In the above chopping arrangement, about half the input light is intercepted by the opaque portion of the grating 15. This loss of light may be avoided by the second chopping method shown in FIGURE 1*b*. Here the chopping action is accomplished by the reciprocating action 13′ of a lenticular plate 20 placed close to the surface of intensifier 19. The lenticles such as 22 of lenticular plate 20 concentrate the light as indicated by rays 21 from the imaging lens 11′ into an array of fine dots or lines (depending on whether the lenticular plate 20 has spherical or cylindrical elements). Between these dots or lines the intensifier 19 will be unilluminated. The spacing between lenticular elements such as 22 is equal to the spacing between the elements of intensifier 19. The motion of lenticular plate 20 is equal to the distance between adjacent elements of intensifier 19. In effect, the same type of chopping action will be produced by reciprocating lenticular plate 20 as in the case of grating 15 of FIGURE 1*a*, except that all of the input light is able to reach intensifier 19. Another advantage of the scheme of FIGURE 1*b* is the fact that input light 10' need not be brought to a focus more than once, while in the case of FIGURE 1*a* an aerial image must be produced in the plane of the reciprocating grating 15. The scheme of FIGURE 1*b* may thereby permit a simplification in the optical system.

The operation of the system as shown in FIGURE 1*a* can be seen to be as follows: Light from a source of image information at 10 is brought to a focus at an image plane 14 by the passage of the rays 12 through imaging lens 11 crossing over as indicated by rays 12' through second imaging lens 16 and being focussed on an element at 18 of image intensifier plate or panel 19. In the image plane 14 grating 15 reciprocates as shown by arrows 13 to alternately interrupt and pass the image onto the elemental point 18. The grating 15 and the image from aerial image plane 14 are both focussed upon the elemental point 18 of image intensifier panel 19. The light is thereby chopped to provide the modulated input light necessary to cause image intensifier panel 19 to emit light.

Only one imaging lens 11' is used in the embodiment shown in FIGURE 1*b* to focus the rays 21 of the input image 10' onto a lenticle 22 of lenticular plate 20 which in turn brings the image to element 18' of intensifier panels 19. As lenticular plate 20 is reciprocated, as indicated at 13', in front of image intensifier panel 19 the point of maximum intensity of the image on point 18' shifts about so as to create the modulating light input necessary to cause image intensifier panel 19 to emit light in accordance with the relative intensity of the point 18' with respect to other points on intensifier panel 19.

The light intensifier panel such as 19 shown in FIGURES 1*a* and 1*b* is shown in detail in one of its embodiments in FIGURE 2.

The solid state image intensifier shown in FIGURE 2 consists of a photoconductive layer 25 separated by an insulator strip 28 from a semiconductor amplifying layer 29 to which is attached an electroluminescent layer 30.

A glass plate 33 protects electroluminescent layer 30.

Alternate electrode strips 26, 26', 27, 27' are attached to the upper surface 34 of photoconductive layer 25. By leads 35, 35' and 35'' the alternate strips 26, 26', 26'' are connected to common lead 36 which is connected to a point of zero potential (ground) at 37. The alternate electrode strips 27, 27' are connected by leads 38, 38' via common lead 39 to the positive pole 40 of battery 41. The negative pole 42 of battery 41 is connected to ground at 37.

While the potential applied to the electrodes 26, 27, etc., of photoconductor 25 is shown here as a battery such as 41 the source of such potential may equally well be a filtered direct current power supply derived from the rectification of alternating current sources as is well known.

Alternate transparent conductive electrode strips 31, 31' and 32, 32' are connected to the outermost surface of electroluminescent layer 30 sandwiched between the electroluminescent layer 30 and the protective glass plate 33.

Leads 43, 43' and 43'' connect alternate transparent electrode strips 31, 31', 31'' via common lead 44 to the ground connection 37. Leads 45, 45' connect alternate transparent electrode strips 32, 32' via common lead 46 to the positive pole 47 of a battery 48. The negative pole 49 of battery 48 is connected to ground at 37.

As a matter of practical manufacturing technique the assembly of image intensifier panel 19 as shown in FIGURE 2 can be accomplished by electro depositive techniques or by any other manner of interlaying the various conductive, amplifying and insulative layers and the electroluminescent phosphor or other emitter materials and the appropriate electrode strips as hereinabove described.

The operation of electroluminescent image intensifier panel 19 as shown in FIGURE 2 may be understood from an examination of the area between electrodes 27 and 26' in the figure indicated as E1 and E2 above the portion C of photoconductive layer 25. An incident light bundle as indicated by bracketed arrows at 50 is assumed to be illuminating half of the photoconductive surface 34 between electrodes 26' and 27 to the left of the reference character C thereon. The circle identified at A represents the center of light bundle 50. If one considers the conductivity of photoconductive layer 25 is greater where it is illuminated than where not illuminated, then there will be a potential difference between E1 and E2 due to the potential of battery 41, but the point C will be closer to the potential of point E1 than that of E2. If now the light bundle 50 is shifted so that the center of light bundle A moves as indicated by arrows 51 towards the circle identified at B, the potential of point C will now be closer to that of point E2. As a result of the reciprocation back and forth of the light bundle 50 as suggested by the double points of arrow 51 which would be due to the action of a light chopper or modulator such as 15 or 20 shown in FIGURE 1, the potential at point C in photoconductor 25 will vary or alternate at the rate of reciprocation of the chopper with an amplitude dependent upon the intensity of the incident light bundle, 50. Adjacent areas between oppositely poled electrodes such as E1 and E2 will also be activated by other light bundles as 50 which may be of different intensities than that of bundle 50 so that for each area so excited there will be alternating conductivities between the electrodes resulting in varying potential differences dependent upon the relative light intensity at each illuminated area or cell.

Below the illuminated area of photoconductive layer 25 the thin insulating layer 28 and the semiconducting layer 29 along with the electrode strips marked F1, F2 on the electroluminescent layer 30 form a field effect transistor in which there is no gate electrode. As in any conventional field effect transistor the modulated potentials resulting from the illumination of point C of the photoconductive layer 25 will modulate the current flowing between electrodes F1 and F2. The electroluminescent layer 30 is a phosphor film and between the semiconducting layer 25 and the electrodes F1 and F2 and is conductive for direct currents so that any steady state current flowing between electrodes F1 and F2 from the battery 49 will pass therethrough. Luminescent layer 30 will emit light, however, only when the modulation of the current is present and of sufficient amplitude. This electroluminescent layer is a compound of zinc sulfide in a suitable plastic or other binder. The thin film in which this electroluminescent layer is positioned between the semiconducting layer and the electrode strips has very fine particles and may in fact be evaporatively deposited on the surface to achieve the thinness desirable in this application thereof. A layer such as that described above has been shown to emit light of considerable intensity for alternating potentials of the order of 10 volts. This is a considerably better result than has been the case with prior art films where as much as 100 volts was required to excite the luminescent layer sufficiently for there to be an appreciable emission of light.

Figure 3:
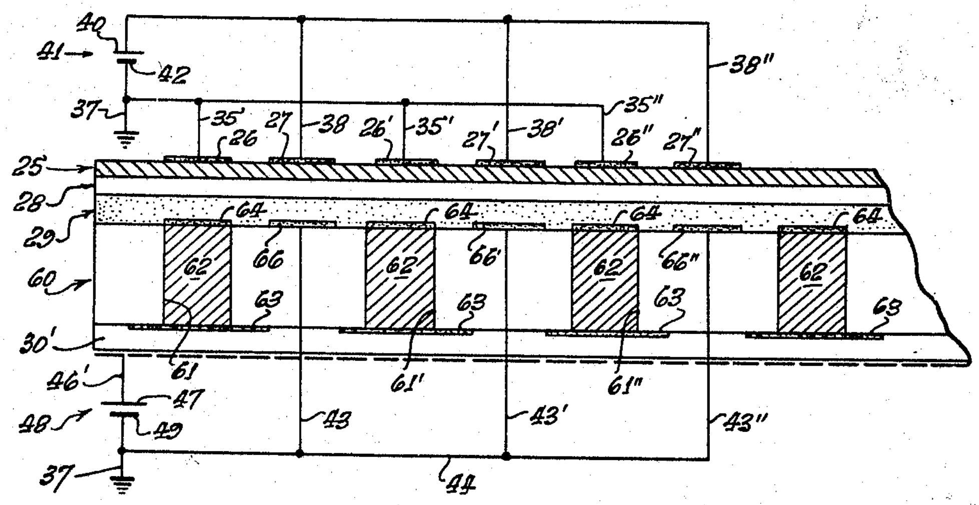
FIGURE 3 is a cross-section through another embodiment of an image intensifier in accordance with this invention.

There is shown in FIGURE 3 a cross section of an alternative structure for the image intensifier plate 19 according to this invention. In FIGURE 3 those elements which correspond to similar or like elements in FIGURE 2 bear the same reference characters. Where there is a difference other characters are used. The photoconducting layer 25, insulating layer 28 and semiconductive layer 29 are used as in the embodiment shown in FIGURE 2. The layers 25, 28 and 29 are separated from the phosphor or luminescent layer 30' by a photoform glass substrate 60 upon which the layers 25, 28 and 29 are deposited. Substrate 60 is a foraminate film, the foramina 61, 61' and 61'', etc. of which are filled with a conductive plastic material 62, or a similar substance, which hereinafter will be identified as conductive cores 62. Conductive elements 63 are in registry and in contact with the bottom surfaces of cores 62. Drain electrodes 64 are in contact with the opposite sides of cores 62 and in contact with semiconducting layer 29. Phosphor or electroluminescent layer 30' is deposited over foraminate photoform glass layer 60 and a transparent electrode 65 deposited over electroluminescent layer 30'. Battery or other source of potential 48 is connected between source electrodes 66 through leads 43, 43' and 43'', common lead 44 to ground 37 and lead 46' to the transparent electrode 65 on electroluminescent layer 30', completing the circuit to semiconductive layer 29 through cores 62 and electrode contacts 63 and drain electrodes 64.

Despite the structural differences therebetween the operation of the embodiment of electroluminescent image intensifier panel 19 shown in FIGURE 3 is the same as that shown in FIGURE 2. The advantages of the device shown in FIGURE 3 lie mainly in the reduction of danger of chemical interaction between the phosphorescent materials and those of the semiconducting layer during fabrication of the electroluminescent image intensifier panel.

Figure 4:
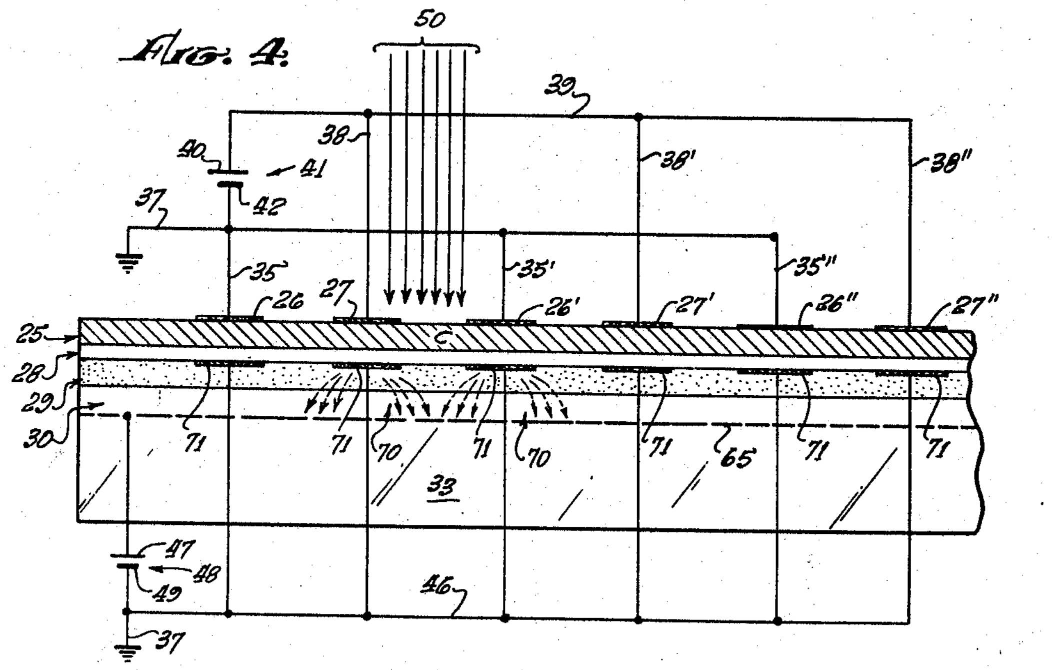
FIGURE 4 is a cross-section through still another embodiment of an image intensifier according to this invention.

A more compact version of the electroluminescent image amplifying panel 19 is shown in FIGURE 4. In the device shown in FIGURE 4 the photoconductive layer 25, insulating layer 28, semiconducting amplifying layer 29 and electroluminescent layer 30 are, as may be seen, much closer together than in the devices shown in FIGURES 2 and 3. The drain electrodes 65 in FIGURE 4 can be seen to be in contact with electroluminescent layer 30 and between layer 30 and a glass plate 33. It should be noted that drain electrode 65 is in fact a very thin transparent conductive film deposited on glass base 33. The remaining layers 30, 29, 28, 25 may be deposited in sequence thereover.

In exactly the same manner as previously described for FIGURES 2 and 3 the rays of light bundle 50 impinge on area C to cause a variation in conductivity of the area of photoconductive layer 25 between electrodes 27 and 26'. This results in a current flow variation as indicated by arrows 70 between transparent drain electrodes 65 and adjacent source electrodes 71. Source and drain electrodes are connected with the appropriate terminals 47, 49 of battery 48.

In all of the structures described above for different embodiments of electroluminescent image amplifying panel 19, namely those in FIGURES 2, 3 and 4, optical feedback is controlled in the following manner. The spectral responses of the photoconductive layer 25 and the spectral emission characteristic of the phosphor in electroluminescent layer 30 are selected so that they do not overlap in the electromagnetic radiation spectrum for light.

Another means whereby the control of optical feedback is achieved is to interpose an opaque barrier between the electroluminescent phosphor layer 30 and the photoconductive layer 25. This may be acomplished by utilizing an opaque insulative layer for layer 28.

By the use for example, of a blue emitting phosphor for surface 30 with an infrared sensitive photoconductor for 25, the feedback factor can be reduced to $10^{-2}$ or less.

In the image intensifier panel shown in FIGURE 3, the photoformed foraminate layer 60 may be made the opaque layer.

There has been described hereinabove in several embodiments thereof an electroluminescent image intensifier panel having a substantial gain. The panel comprises a photoconductive layer 25 which is exposed to the source of light producing the image information. The exposure is through a reciprocating grating 15 or lenticular plate 20 which results in a modulated light area on each unit element of the photoconducting layer 25 between adjacent parallel electrode strips. The adjacent electrode strips are connected to a source of direct current potential. The modulated light on each area varies the direct current flowing between the electrode strips.

A semiconducting amplifying layer 29 separated from the photoconductive layer 25 by an insulating layer 28, and having in contact with the opposite side thereof an electroluminescent layer 30 forms a field effect transistor. The transistor is connected with appropriate D-C potentials so that the variation in the direct current in the photoconductive layer excites the field effect transistor to vary its current flowing across the electroluminescent layer. The variations in current cause the phosphor of the electroluminescent layer to emit light of greater intensity than would normally result from such incident light. In the absence of any variations no light is emitted by the luminescent layer.

What is claimed as new is:

1. A chopped light image intensifier comprising:

photoconductive means disposed in an exposed relation to an external source of light image information;

first electrode means including alternate electrode elements connected together disposed on one surface of said photoconductive means;

a light interrupting means interposed between said photoconductive means and said external source of light image information whereby the light rays of said image information are modulated by the interruptions of said light interrupting means as the light rays impinge upon said photoconductive means;

a first source of direct current potential connected to said first electrode means, so as to create a normally occurring continuous current between said alternate electrode elements, said continuous current being modulated by the operation of said light interrupting means interposed between said photoconductive means and said source of light image information;

a semiconductive amplifying means having a semiconducting layer and an electroluminescent layer, said semiconducting layer being separated from said photoconductive means by an insulating layer;

second electrode means disposed on opposite sides of said semiconductive amplifying means; and, a second source of direct current potential connected to said second electrode means to provide a continuous direct current flow across the path between said semiconducting layer thereof and said electroluminescent layer thereof;

whereby, said modulated light rays excite said photoconductive layer to excite said semiconductive amplifying means thereby to cause said electroluminescent layer thereof to emit light, said electroluminescent layer being non-emissive in the absence of said modulated light and in the absence of any variation in the current through said semiconductive amplifying means.

2. A chopped light image intensifier comprising:

photoconductive means disposed in an exposed relation to an external source of light image information;

a first electrode grid having alternate electrode elements connected together disposed on one surface of said photoconductive means;

a light modulating means interposed between said photoconductive means and said external source of light image information whereby the light rays of said image information are modulated as they impinge upon said photoconductive means;

a first source of direct current potential connected to said electrode grid so as to create a normally occurring continuous current between adjacent ones of said alternatae electrode elements of said electrode grid, said continuous current being modulated by the operation of said light modulating means interposed between said photoconductive means and said source of light image information;

a semiconductive amplifying means having a semiconducting layer and an electroluminescent phosphor layer, said semiconducting layer being separated from said photoconductive means by an insulating layer;

a second electrode grid disposed on opposite sides of said semiconductive amplifying means; and a second source of direct current potential connected to said second electrode grid to provide a continuous direct current flow across the path between said semiconducting layer thereof and said electroluminescent phosphor layer thereof;

whereby, said modulated light rays excite said photoconductive layer to excite said semiconductive amplifying means thereby to cause said electroluminescent phosphor layer thereof to emit light, said electroluminescent phosphor layer being non-emissive in the absence of said modulated light and in the absence of any variation in the current through said semiconductive amplifying means.

3. A chopped light image intensifier comprising:

a thin film photoconductor;

first electrode means having alternate electrode elements connected together and disposed on one surface of said photoconductor;

a light modulator in the optical path between said photoconductor and an external source of light image information to interrupt said source of light image information to modulate the rays thereof as they impinge upon said photoconductor;

first direct current means connected to said first electrode means for creating a continuous current between adjacent ones of said electrode elements, said continuous current being modulated by the operation of said light modulator;

a thin film semiconductive amplifying means having a semiconducting layer and an electroluminescent layer, said semiconducting layer being separated from said photoconductor by a thin film insulating layer;

second electrode means being disposed on opposite sides of said thin film semiconductive amplifying means; and, second direct current means connected between said second electrode means to provide a continuous direct current flow across the path between said semiconducting layer thereof and said electroluminescent layer thereof;

whereby, said modulator varies the intensity of the light rays of said external source to excite said photoconductor which in turn excites said semiconductive amplifying means thereby to cause said electroluminescent layer thereof to emit light, said electroluminescent layer being non-emissive in the absence of said modulaated light and in the absence of any variation in the current through said semiconductive amplifying means.

4. A chopped light image intensifier comprising:

a photoconductive means;

a light modulating means interposed between said photoconductive means and an external source of light image information whereby the light rays of said source are modulated as they impinge upon said photoconductive means;

a first source of direct current potential connected with said photoconductive means for generating a normally occurring continuous current in said photoconductive means, said continuous current being modulated by the operation of said light modulating means interposed between said photoconductive means and said external source of light image information;

a semiconductive amplifying means including a semiconducting layer and an electroluminescent layer, said semiconducting layer being separated from said photoconductive means by an insulating layer; and, a second source of direct current potential connected with said semiconductive amplifying means to provide a continuous direct current flow across the path between said semiconducting layer thereof and said electroluminescent layer thereof;

whereby, said modulated light rays excite said photoconductive means to in turn excite said semiconductive amplifying means thereby to cause said electroluminescent phosphor layer thereof to emit light, said electroluminescent layer being non-emissive in the absence of said modulated light and in the absence of any variation in the current through said semiconductive amplifying means.

5. A chopped light image intensifier comprising:

a photoconductive layer;

first electrode means having alternate electrodes thereof connected together and disposed on one surface of said photoconductive layer;

a light modulating means interposed between said photoconductive layer and an external source of light image information whereby the light rays of said source are modulated as they impinge upon said photoconductive layer;

a first direct current potential means connected to said first electrode means, for developing a continuous current between adjacent alternate electrodes thereof, said continuous current being modulated by the operation of said light interrupting means interposed between said photoconductive layer and said source of light image information;

a semiconductive amplifying layer having a semiconducting portion and an electroluminescent portion said semiconducting portion being separated from said photoconductive layer by an insulating layer;

second electrode means disposed on opposite sides of said semiconductive amplifying means; and a second direct current potential means connected to said second electrode means for developing a continuous direct current flow across said semiconductive amplifying layer in the path between said semiconducting portion thereof and said electroluminescent portion thereof;

whereby, said modulated light rays excite said photoconductive layer to excite said semiconductive amplifying layer thereby to cause said electroluminescent portion thereof to emit light, said electroluminescent portion being non-emissive in the absence of said modulated light and in the absence of any variation in the current through said semiconductive amplifying layer.

6. A chopped light image intensifier comprising:

photoconductive means disposed in an exposed relation to an external source of light image information;

first electrode means disposed on one surface of said photoconductive means;

a reciprocating grating interposed between said photoconductive means and said external source of light image information whereby the light rays of said image information are modulated as they impinge upon said photoconductive means;

a first source of direct current potential connected between adjacent ones of said electrode means, so as to create a first normally occurring continuous current between said electrodes said continuous current being modulated by the operation of said light interrupting means interposed between said photoconductive means and said source of light image information;

a semiconductive amplifying means having a semiconducting layer and an electroluminescent layer, said semiconducting layer being separated from said photoconducting means by an insulating layer;

second electrode means disposed on opposite sides of said semiconductive amplifying means; and,
a second source of direct current potential connected between said second electrode means to provide a second normally occurring continuous current flow across the path between said semiconducting layer thereof and said electroluminescent layer thereof;
whereby, said modulated light rays excite said photoconductive layer varying the continuous current therein to excite said semiconductive amplifying means, varying the continuous current in said amplifying means thereby to cause said electroluminescent phosphor layer thereof to emit light, said electroluminescent layer being non-emissive in the presence of said first and second normally occurring continuous currents in the absence of said modulated light and in the absence of any variation in the current through said semiconductive amplifying means.

7. An interrupted light image intensifier comprising:
a photoconductive layer disposed on one side of an insulative surface in an exposed relation to an external source of light image information;
an electrode grid having alternate ones of the electrodes thereof connected together and disposed on one surface of said photoconductive means;
a reciprocating lenticular grating interposed between said photoconductive layer and said external source of light image information whereby the light rays of any point in said image information are modulated as they impinge upon said photoconductive layer;
a first source of direct current potential connected between adjacent ones of the alternate electrodes of said electrode grid for developing therebetween a normal continuous current, said continuous current being modulated by the operation of said lenticular grating interposed between said photoconductive layer and said source of light image information;
a semiconductive amplifying layer having a semiconducting layer and an electroluminescent layer, said semiconducting layer being separated from said photoconducting layer by said insulating layer;
source and drain electrodes disposed on opposite sides of said semiconductive amplifying layer; and,
a second source of direct current potential connected between said source and drain electrodes to provide a normal continuous current flow through said semiconductive amplifying layer across the path between said semiconducting layer thereof and said electroluminescent layer thereof;
whereby, said modulated light rays excite said photoconductive layer to vary said normal continuous current thereon to excite said semiconductive amplifying layer thereby to vary said normal current therethrough to cause said electroluminescent layer thereof to emit light, said electroluminescent layer being non-emissive in the absence of said modulation of said light rays and in the absence of any variation in the current through said semiconductive amplifying layer.

8. A chopped light image intensifier comprising:
photoconductive means disposed in an exposed relation to an external source of light image information;
first electrode means disposed on one surface of said photoconductive means;
a light interrupting means interposed between said photoconductive means and said external source of light image information whereby the light rays of said image information are modulated as they impinge upon said photoconductive means;
a first source of direct current potential connected between adjacent ones of said electrode means, so as to create a normally occurring continuous current between said electrodes, said continuous current being modulated by the operation of said light interrupting means interposed between said photoconductive means and said source of light information;

a semiconductive amplifying means having a semiconducting layer and an electroluminescent layer disposed on either side of a foraminate photoformed glass plate, said semiconducting layer being separated from said photoconducting layer by an insulating layer, the foramina of said foraminate plate being filled with conductive core elements interconnecting said semiconducting layer with said electroluminescent layer;
source electrode means disposed on opposite sides of said conductive core elements;
drain electrode means disposed on said electroluminescent layer on the side opposite said foraminate plate; and,
a second source of direct current potential connected between said source electrode means and said drain electrode means, to provide a continuous direct current flow across the path between said semiconducting layer thereof and said electroluminescent layer thereof;
whereby said modulated light rays excite said photoconductive layer to vary the current therein to excite said semiconductive amplifying layer to vary the current therein thereby to cause said electroluminescent layer thereof to emit light, said electroluminescent layer being non-emissive in the presence of said normal current and in the absence of said modulated light and in the absence of any variation in the current through said semiconductive amplifying layer.

9. A chopped light image intensifier comprising:
a thin film photoconductor disposed on an insulating layer in an exposed relation to an external source of light image information;
an electrode grid of alternately polarized adjacent elements disposed on the exposed surface of said photoconductor and connected to a first source of direct current to provide a continuous direct current flow between said adjacent elements;
a light interruptor interposed between said photoconductor and said external source of light image information whereby the light rays of said source impinging on said photoconductor in the areas between said alternately polarized elements of said electrode grid, are modulated thereby to vary said direct current in accordance therewith;
a thin film semiconductor amplifier having a semiconducting layer and an electroluminescent layer, said semiconducting layer being separated from said photoconductor by said insulating layer;
a source electrode grid disposed on one side of said semiconductor amplifier;
a drain electrode grid disposed on the other side of said semiconductor amplifier;
said source and drain grids being in alignment with said polarized elements of said electrode grid; and,
a second source of direct current connected between said source electrode grid and said drain electrode grid to provide a continuous direct current flow across the path between said semiconducting layer and said electroluminescent layer of said amplifier;
whereby when said modulated light rays excite said photoconductor the resulting variation in the direct current between said polarized electrodes excite said semiconductive amplifying layer thereby to cause said electroluminescent layer thereof to emit light, said electroluminescent layer being non-emissive when said light is not modulated and in the concurrent absence of any variation in the current through said semiconductor amplifier.

10. An image intensifier panel comprising:
a photoconductive layer;
a semiconducting amplifier layer; and,
an electroluminescent layer, said electroluminescent layer is comprised of materials having the property of emitting no light in the presence of a continuous current therethrough and emitting substantial light when said continuous current is modulated by variable light impinging on the surface of said intensifier, said photoconductive layer, said semiconductive amplifier layer and said electroluminescent layer being electrically intercoupled and said photoconductive layer being adapted to be excited by said variable light and being responsive thereto to excite said semiconductive amplifier layer, said semiconductive amplifier layer being responsive to said excitation by said photoconductive layer to excite said electroluminescent.

11. In a chopped light image intensifier the combination of:

photoconductive means disposed in an exposed relation to an external source of light image information;

a first plurality of electrode means disposed on the exposed surface of said photoconductive means;

a light interrupting means interposed between said photoconductive means and said external source of light image information whereby the light rays of said source impinging on said photoconductive means are modulated;

a first source of direct current potential connected between adjacent ones of said first electrode means, so as to create a normally occurring continuous current between said first electrodes, said continuous current being modulated by the action of said light interrupting means on said photoconductive means;

a semiconductive amplifying means having a semiconducting layer and an electroluminescent layer, said semiconductor layer being separated from said photoconductive means by an insulating layer and said amplifying means being responsive to the modulation of the current of said photoconductive means;

a second plurality of electrode means disposed on opposite sides of said semiconductive amplifying means in alignment with said first electrode means; and a second source of direct current potential connected between said second electrode means to provide a continuous direct current flow across said semiconductive amplifying means in the path between said semiconducting layer thereof and said electroluminescent layer thereof;

whereby, when said modulated light rays excite said photoconductive layer to vary the current therein said semiconductive amplifying means is excited thereby to cause said electroluminescent phosphor layer thereof to emit light of greater intensity than said source of light, said electroluminescent layer being non-emissive in the absence of said modulated light and in the absence of any variation in the current through said semiconductive amplifying means.

12. In a chopped light image intensifier the combination of:

a photoconductive means; and, a semiconductive amplifying means having a semiconducting layer and an electroluminescent layer, separated by an insulating layer, said semiconducting layer being separated from said photoconductive means by another insulating layer;

whereby, when a pattern of modulated light rays excites said photoconductive means said semiconductive amplifying means is excited thereby to cause said electroluminescent layer thereof to emit light, a brighter light than said light rays but corresponding entirely to the pattern of said light rays.

13. A chopped light image amplifier stabilized against optical feedback comprising:

a photoconductive layer being responsive to light in the red region of the visible spectrum;

an insulative layer;

a semiconducting amplifier layer, said semiconducting amplifier layer and said photoconductive layer being on opposite sides of said insulative layer;

said semiconducting layer including a thin-film semiconducting layer near said insulative layer, and an electroluminescent phosphor layer, the phosphor of said electroluminescent layer being most responsive in the blue region of the visible spectrum;

whereby, due to the difference in spectral responsiveness of said photoconductive layer and said electroluminescent layer, optical feedback is minimized.

14. A chopped light image intensifier panel stabilized against optical feedback comprising:

a photoconductive layer;

a semiconducting amplifier layer having a semiconducting layer and an electroluminescent light emitting layer; and, an opaque insulative layer interposed between said photoconductive and said semiconducting amplifier layer;

whereby optical feedback between said photoconductive and said light emitting layer is minimized.

15. A chopped light image intensifier panel stabilized against optical feedback comprising:

a photoconductive layer;

a semiconducting amplifier layer having a semiconductor layer and an electroluminescent phosphor layer, said semiconductor layer being separated from said photoconductive layer by an insulative layer; and, an opaque foraminate insulative plate interposed between said semiconductor layer and said electroluminescent layer, the foramina of said insulative plate having conducting cores therein interconnecting electrode grid elements on opposite sides thereof;

whereby, optical feedback between said electroluminescent layer and said photoconductive layer is minimized.

16. An image intensifier panel comprising:

a photoconductive layer;

a semiconductor amplifier layer;

an electroluminescent layer;

an insulative layer interposed between said photoconductive layer and said semiconducting layer; and another insulative layer interposed between said semiconducting layer and said electroluminescent layer.

17. An image intensifier panel comprising:

photoconductive means disposed in an exposed relation to an external source of light image information;

a first plurality of electrode means disposed on the exposed surface of said photoconductive means;

a first source of direct current potential connected between adjacent ones of said first electrode means, so as to create a normally occurring continuous current between said first electrodes, said continuous current being modulated by the action of said light interrupting means on said photoconductive means;

a semiconductor amplifier having an electroluminescent output surface, said amplifier being electrically coupled with and being responsive to variations in conductivity of said photoconductor to develop an intensified light emission corresponding to said variations in conductivity of said photoconductor due to a modulated image impinging on said photoconductor;

a second plurality electrode means disposed on opposite sides of said semiconductive amplifying means in alignment with said first electrode means; and, a second source of direct current potential connected between said second electrode means to provide a continuous direct current flow across said semiconductive amplifying means in the path between said semiconducting layer thereof and said electroluminescent layer thereof.

18. In an optical image intensifier panel including a semiconductor layer and an electroluminescent layer responsive to chopped light, means for minimizing the optical feedback of the input and output thereof, said means comprising:

an opaque insulating layer interposed between said semiconducting layer and said electroluminescent layer thereof.

References Cited

UNITED STATES PATENTS

| | | | |
|---|---|---|---|
| 2,884,541 | 4/1959 | Nicoll | 250—213 |
| 2,920,232 | 1/1960 | Evans | 250—213 X |
| 2,931,915 | 4/1960 | Jay | 250—213 |
| 2,959,681 | 11/1960 | Noyce | 250—211 |
| 3,033,989 | 5/1962 | Kazan | 250—213 |
| 3,246,162 | 4/1966 | Chin | 250—213 X |
| 3,312,825 | 4/1967 | Robinson | 250—213 |
| 3,339,074 | 8/1967 | Franks | 250—213 |

RALPH G. NILSON, *Primary Examiner.*

M. A. LEAVITT, *Assistant Examiner.*

U.S. Cl. X.R.

250—211